(12) United States Patent
Qureshi (10) Patent No.: US 9,698,750 B2
(45) Date of Patent: Jul. 4, 2017

(54) CIRCUIT

(71) Applicant: Ampleon Netherlands B.V., Nijmegen (NL)

(72) Inventor: Jawad Hussain Qureshi, Gelderland (NL)

(73) Assignee: Ampleon Netherlands B.V., Nijmegen (NL)

(*) Notice: Subject to any disclaimer, the term of this patent is extended or adjusted under 35 U.S.C. 154(b) by 0 days.

(21) Appl. No.: 14/588,581

(22) Filed: Jan. 2, 2015

(65) Prior Publication Data
US 2015/0214919 A1    Jul. 30, 2015

(30) Foreign Application Priority Data

Jan. 24, 2014  (EP) .................................... 14152532

(51) Int. Cl.
| | | |
|---|---|---|
| *H03H 7/42* | (2006.01) | |
| *H01P 5/10* | (2006.01) | |
| *H03F 1/56* | (2006.01) | |
| *H03F 3/26* | (2006.01) | |
| *H03F 3/60* | (2006.01) | |

(Continued)

(52) U.S. Cl.
CPC ............ *H03H 7/42* (2013.01); *H01P 5/10* (2013.01); *H03F 1/56* (2013.01); *H03F 3/265* (2013.01); *H03F 3/604* (2013.01); *H03H 7/383* (2013.01); *H03H 7/422* (2013.01); *H03H 11/32* (2013.01); *H03F 2200/09* (2013.01); *H03F 2200/387* (2013.01); *H03F 2200/423* (2013.01)

(58) Field of Classification Search
CPC ............... H03H 7/42; H03H 7/38; H01P 5/10

USPC ............................................. 333/25, 26, 5
See application file for complete search history.

(56) References Cited

U.S. PATENT DOCUMENTS

| | | |
|---|---|---|
| 5,025,232 A | 6/1991 | Pavio |
| 5,061,910 A | 10/1991 | Bouny |

(Continued)

FOREIGN PATENT DOCUMENTS

| | | |
|---|---|---|
| JP | 62-21617 | 2/1987 |
| JP | 2008 236205 A | 10/2008 |

OTHER PUBLICATIONS

NXP; "BLF888A/B Devices—UHF power LDMOS Transistor, Rev. 5"; Product Data Sheet; retrieved from the internet www.nxp.com; 17 pages; (Nov. 4, 2013).

(Continued)

*Primary Examiner* — Dean Takaoka
(74) *Attorney, Agent, or Firm* — McDonnell Boehnen Hulbert & Berghoff LLP (57) ABSTRACT

The disclosure relates to a circuit comprising a balun portion, a balanced side impedance transforming element and an unbalanced side impedance transforming element. The balun portion at least partly transforms the signal between a balanced signal input/output terminal and an unbalanced signal input/output terminal. The impedance transforming elements at least partly alter the impedance presented at the balanced and unbalanced side of the balun. In addition at least one matching transmission element is provided.

By separating the role of impedance transformation from balun signal conversion, the useful bandwidth of the circuit can be improved in comparison to a balun that provides both signal conversion and impedance transformation functions.

13 Claims, 6 Drawing Sheets

(51) Int. Cl.
*H03H 7/38* (2006.01)
*H03H 11/32* (2006.01)

(56) References Cited

U.S. PATENT DOCUMENTS

| | | | | |
|---|---|---|---|---|
| 6,819,200 | B2 * | 11/2004 | Zhao | H03H 7/42 |
| | | | | 333/25 |
| 7,528,676 | B2 * | 5/2009 | Kearns | H01P 5/10 |
| | | | | 333/185 |
| 7,880,557 | B2 * | 2/2011 | Jiang | H03D 7/1408 |
| | | | | 333/116 |
| 2002/0171529 | A1 | 11/2002 | Tang | |
| 2005/0088252 | A1 | 4/2005 | Burns et al. | |
| 2006/0284698 | A1 | 12/2006 | Vaisanen | |
| 2007/0132526 | A1 | 6/2007 | Wei et al. | |
| 2013/0093531 | A1 | 4/2013 | Ujita et al. | |
| 2013/0222061 | A1 | 8/2013 | Goumas et al. | |

OTHER PUBLICATIONS

Marchand, N.; "Transmission-Line Conversion Transformers"; Electronics, vol. 17; pp. 142-146 (Dec. 1944).
Sun, Jwo-Shiun et al; "Design of a Planar Microstrip Balun at S-band Desgin" Microwave Journal; retrieved from the internet http://www.microwavejournal.com/articles/3265-desig-of-a-planar-microstrip-balun-at-s-band; 7 pages (Aug. 2001).
Ang, Kian Sen et al.; "Analysis and Design of Impedance-Transforming Planar Marchand Baluns"; IEEE Transactions on Microwave Theory and Techniques, vol. 49, No. 2; pp. 402-406 (Feb. 2001).
Extended European Search Report for application No. 14152532.9 (Jun. 26, 2014).

* cited by examiner

CIRCUIT

The disclosure relates in particular, but not exclusively, to a circuit for transforming impedance and converting between a balanced signal and an unbalanced signal.

CROSS-REFERENCE TO RELATED APPLICATIONS

This application claims the priority under 35 U.S.C. §119 of European patent application no. 14152532.9, filed on Jan. 24, 2014, the contents of which are incorporated by reference herein.

High power amplifier (PA) devices typically require a very low output load. The output impedance matching requirements of the Doherty amplifier is becoming tighter for the newer high power PA devices. In some cases, matching to an output impedance of less than 2Ω may be required. Moreover, in ultra-wideband Doherty type configurations the combining point impedance (impedance at the point where the output power of the main and the peak devices is combined) may drop to as low as 1Ω.

However, the majority of devices with which the Doherty amplifiers are integrated are matched to a 50Ω impedance by convention. The Doherty amplifiers therefore should be matched to 50Ω before they can be used in 50Ω applications so that substantial signal reflection and power loss is reduced or prevented.

In order to address the above impedance matching problem, a Doherty amplifier may be operated in a push-pull configuration and first matched to some convenient impedance level, which may be 12.5Ω. An impedance transforming balun can be used to transform from 12.5Ω differential (or balanced side) to 50Ω single ended (or unbalanced side). A coaxial cable based balun structure may be used. However, such an arrangement may not provide suitable bandwidth for some Doherty amplifier configurations, such as the ultra-wideband configuration, for example.

According to a first aspect of the invention there is provided a circuit comprising:
- a first balanced terminal; a second balanced terminal; an unbalanced terminal; a ground terminal;
- a balun portion comprising:
  - a first balanced node, a second balanced node, an unbalanced node connected to the unbalanced terminal,
  - a first transmission line with a first end and a second end, the second end of the first transmission line connected to the unbalanced node,
  - a second transmission line with a first end and a second end, the second transmission line capacitively and/or inductively coupled to the first transmission line, the first end of the second transmission line connected to the first balanced node, wherein the second end of the second transmission line is connected to the ground terminal,
  - a third transmission line with a first end and a second end, the first end of the third transmission line connected to the first end of the first transmission line, wherein the second end of the third transmission line is connected to the ground terminal,
  - a fourth transmission line with a first end and a second end, the first end of the fourth transmission line connected to the second balanced node, the fourth transmission line capacitively and/or inductively coupled to the third transmission line, wherein the second end of the fourth transmission line is connected to the ground terminal, and
- at least one matching transmission element configured to present an impedance at one of the first balanced node, second balanced node or unbalanced node; and
- a balanced side impedance transforming element comprising:
  - a fifth transmission line connected between the first balanced terminal and the first balanced node of the balun portion, and
  - a sixth transmission line connected between the second balanced terminal and the second balanced node of the balun portion, the sixth transmission line capacitively and/or inductively coupled to the fifth transmission line.

The balun portion can at least partly transform the signal between a balanced signal and an unbalanced signal. The impedance transforming elements can at least partly alter the impedance presented at the balanced and unbalanced side of the balun. By separating the role of impedance transformation from balun signal conversion, the useful bandwidth of the circuit can be improved in comparison to a balun that provides both signal conversion and impedance transformation functions. The circuit may therefore provide a relatively high ratio of impedance transformation over a very wide bandwidth compared to at least some prior art solutions.

The circuit may comprise an unbalanced side impedance transforming element. The unbalanced side impedance transforming element may be connected between the unbalanced terminal and the unbalanced node of the balun portion. Providing an additional impedance transforming element may improve the bandwidth of the circuit because the impedance transforming workload is split between more elements.

The circuit may comprise a planar layer. The planar layer may comprise a dielectric material. The transmission lines and/or transmission elements may be disposed on the planar layer. A planar structure may be advantageous as it can decrease the number of external components and decrease variation in the assembly process. An advantage of such a structure is that reproducible circuit behaviour (due to a greater uniformity in construction) may be achieved without the need to tune the circuit.

Each pair of capacitively and/or inductively coupled transmission lines may be a pair of broad-side coupled transmission lines. The respective pairs of broad-side coupled transmission lines may be disposed on opposing surface of the planar layer. A broad-side coupled transmission line has the property that only odd mode signals can pass through it and it presents an open circuit to even mode signals. Therefore the 2nd harmonic termination may be fixed to an open circuit condition by the third pair of coupled transmission lines. That is, even mode signals at the balanced side terminals may be suppressed or rejected. The suppression of even mode signals improves the power efficiency of the circuit, or a circuit/component (such as a power amplifier, or a push-pull amplifier) connected to it. The useful bandwidth of the circuit can also be increased because even mode signals are suppressed and so do not interfere with other signals within the operating frequency range.

At least one matching transmission element may be connected between the ground terminal and one of the first balanced node, second balanced node or unbalanced node. At least one matching transmission element may be connected between the unbalanced node and the second end of the first transmission line. At least one matching transmission element may comprise a first matching transmission element and a second matching transmission element. The first matching transmission element may be connected between the second balanced node and the first end of the second transmission line. The second matching transmission element may be connected between the first balanced node and the first end of the fourth transmission line. The first matching transmission element may be a first matching transmission line. The second matching transmission element may be a second matching transmission line. The second matching transmission line may be capacitively and/or inductively coupled to the first matching transmission line.

The circuit may comprise an impedance tuning capacitor. The impedance tuning capacitor may be connected between the first balanced node and the second balanced node. The impedance tuning capacitor may be connected between the second end of the fifth transmission line and the second end of the sixth transmission line. That is, the impedance tuning capacitor may be connected between the first end of the second transmission line and the first end of the fourth transmission line.

The balun portion may comprise a first DC decoupling capacitor. The balun portion may comprise a second DC decoupling capacitor. The first DC decoupling capacitor may be connected between the second end of the second transmission line and the ground terminal. The second DC decoupling capacitor may be connected between the second end of the fourth transmission line and the ground terminal.

The unbalanced side impedance transforming element may comprise a transmission line. The transmission line may be connected between the unbalanced terminal and the second end of the second transmission line.

One or more of the transmission lines of the circuit may be a one quarter wavelength transmission line relative to an operating frequency. One or more of the transmission lines of the circuit may be a one quarter wavelength transmission line relative to a midpoint of an operating frequency range. One or more of the transmission lines of the circuit may comprise a strip-line or micro-strip.

The circuit may comprise an amplifier having a first amplifier output terminal and a second amplifier output terminal. The first and second amplifier output terminals are each coupled to a respective one of the first and second balanced terminal. The amplifier may be a push-pull amplifier.

According to a further aspect of the invention there is provided a UHF or VHF transmitter comprising any circuit described herein.

BRIEF DESCRIPTION OF THE DRAWINGS

Embodiments will now be described by way of example with reference to the accompanying figures, in which.

DETAILED DESCRIPTION

Figure 1:
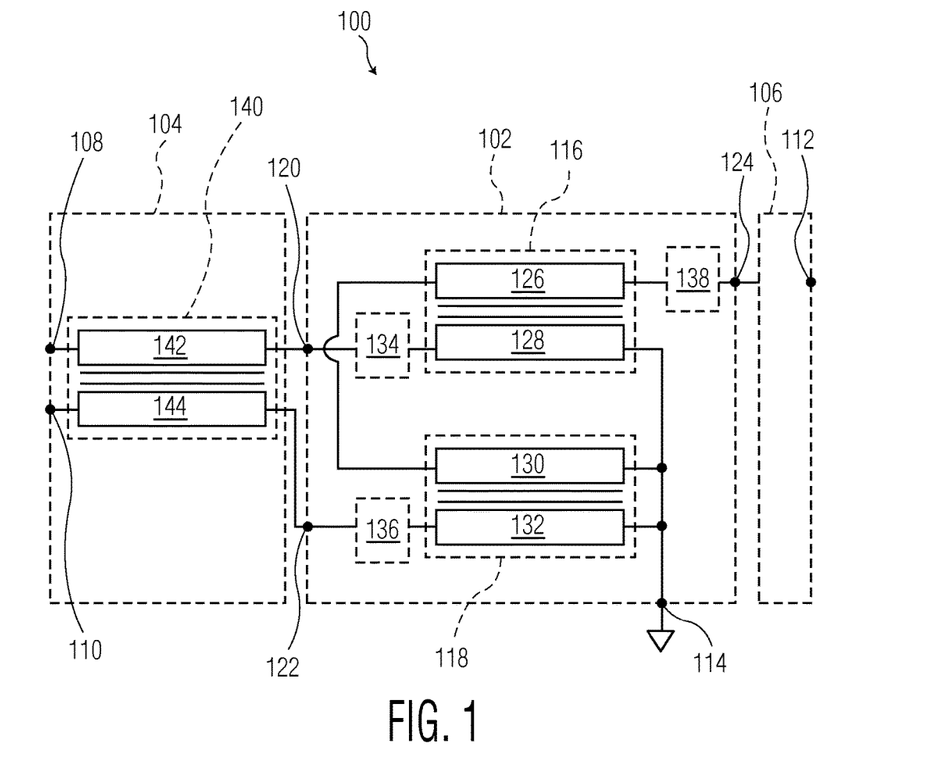
FIG. 1 illustrates an impedance transforming balun circuit.

FIG. 1 illustrates an impedance transforming balun circuit 100. The circuit 100 comprises three portions: a balun portion 102; a balanced side impedance transforming element 104 and an unbalanced side impedance transforming element 106. The balanced and unbalanced side impedance transforming elements 106, 108 are connected to opposing sides of the balun portion 102.

The impedance transforming balun circuit 100 provides a stepped impedance transformer. Each of the three portions can be configured to form a quarter wave transmission line at a desired frequency. Further, the impedance of each section can be chosen to obtain a desired impedance transformation response over the desired frequency band.

The balun portion 102 at least partly transforms the signal between a balanced signal and an unbalanced signal. The impedance transforming elements 104, 106 at least partly alter the impedance presented at the balanced and unbalanced side of the balun portion 102 so that the impedance at the balanced side is, for example, 1.25Ω and the impedance at the unbalanced side is, for example, 50Ω. In addition, the balanced side impedance transforming element 104 is configured to reject common mode signals. By separating the role of impedance transformation from balun signal conversion, the useful bandwidth of the circuit 100 can be improved in comparison with a balun that provides both signal conversion and impedance transformation functions.

A first balanced input/output terminal 108 and a second balanced input/output terminal 110 are provided by the balanced side impedance transforming element 104. An unbalanced input/output terminal 112 is provided by the unbalanced side impedance transforming element 106. A ground terminal 114 is provided in connection with the balun portion 102.

The balun portion 102 comprises a first pair of coupled transmission lines 116, a second pair of coupled transmission lines 118, a first balanced node 120, a second balanced node 122 and an unbalanced node 124. The first pair of coupled transmission lines 116 is configured to convey a signal between the first balanced terminal 120 and the unbalanced terminal 124. The first pair of coupled transmission lines 116 comprises a first transmission line 126 and a second transmission line 128. The second transmission line 128 is capacitively and/or inductively coupled to the first transmission line 126. The first transmission line 126 has a first end and a second end. The term "end" of a transmission line may simply mean a point of connection for the transmission line, and is not necessarily an ultimate termination of the transmission line. The second end of the first transmission line 126 is connected to the unbalanced node 124. The second transmission line 128 also has a first end and a second end. The first end of the second transmission line 128 is connected to the first balanced node 120. The second end of the second transmission line 128 is connected to the ground terminal 114.

The second pair of coupled transmission lines 118 is configured to convey a signal between the second balanced terminal 122 and the unbalanced terminal 124. The second pair of coupled transmission lines 118 comprises a third transmission line 130 and a fourth transmission line 132. The fourth transmission line 132 is capacitively and/or inductively coupled to the third transmission line 130. The third transmission line 130 has a first end and a second end. The first end of the third transmission line 130 is connected to the first end of the first transmission line 126. The second end of the third transmission line 130 is connected to the ground terminal 114. The fourth transmission line 132 also has a first end and a second end. The first end of the fourth transmission line 132 is connected to the second balanced node 122. The second end of the fourth transmission line 132 is connected to the ground terminal 114.

The balun portion comprises a least one matching transmission elements 134, 136, 138. Three optional matching transmission elements 134, 136, 138 are illustrated as part of the balun portion 102 in FIG. 1. The matching transmission elements 134, 136, 138 can be used to improve the impedance matching at the nodes 120, 122, 124 of the balun portion 102 by presenting an additional impedance at the nodes. The matching transmission elements 134, 136, 138 can be configured to ensure that the balun portion 102 as a whole provides a $\lambda/4$ phase shift, for example, where $\lambda$ is a midpoint of the intended operating frequency range of the circuit 100.

A first matching transmission element 134 is coupled between the first end of the second transmission line 128 and the first balanced node 120. A second matching transmission element 136 is coupled between the first end of the fourth transmission line 132 and the second balanced node 122. A third matching transmission element 138 is coupled between the second end of the first transmission line 126 and the unbalanced node 124.

A transmission element can be implemented using a transmission line, for example. Alternatively, a transmission element may be implemented using other inductive or capacitive components, such as bond wires. In one example, each of the first, second and third matching elements 134, 136, 138 is provided. Alternatively, only the first and second matching elements 134, 136 are provided. In a further alternative, only the third matching element 138 is provided.

Each matching transmission element is connected, indirectly in the example of FIG. 1, between the ground terminal 114 and one of the first balanced node 120, second balanced node 122 or unbalanced node 124. The first matching transmission element 134 is connected to the ground terminal 114 by the second transmission line 128. The second matching transmission element 136 is connected to the ground terminal 114 by the fourth transmission line 132. The third matching transmission element 138 is connected to the ground terminal 114 by the first and third transmission lines 126, 130 in series.

The separate balanced side impedance transforming element 104 and the unbalanced side impedance transforming element 106 are provided so that a first impedance can be exhibited at the first balanced input/output terminal 108 and the second balanced input/output terminal 110 and a different, second impedance can be exhibited at the unbalanced input/output terminal 112.

The balanced side impedance transforming element 104 comprises a third pair of coupled transmission lines 140. The third pair of coupled transmission lines 140 comprises a firth transmission line 142 and a sixth transmission line 144. The sixth transmission line 144 is capacitively and/or inductively coupled to the fifth transmission line 142 as broadside coupled transmission lines, or differential lines, for example.

A broad-side coupled transmission line has the property that only odd mode signals can pass through it and it presents an open circuit to even mode signals. Therefore the 2nd harmonic termination of the balun shown in the FIG. 1 is fixed to open by the third pair of coupled transmission lines 140 and, in an ideal case, is not dependent on the characteristics of the other circuit parameters. This is advantageous because suppression of even mode signals improves the power efficiency of the circuit or an associated circuit/component. The useful bandwidth of the circuit can also be increased because even mode signals are suppressed and so do not interfere with other signals within the operating frequency range. The construction of a broad-side coupled transmission line is discussed further with reference to FIG. 2, below. Other transmission lines can be implemented using strip-line or micro-strips, for example.

The fifth transmission line 142 has a first end and a second end. The first end of the fifth transmission line 142 is connected to the first balanced input/output terminal 108. The second end of the fifth transmission line 142 is connected to the first balanced node 120 of the balun portion 102. The sixth transmission line 144 also has a first end and a second end. The first end of the sixth transmission line 144 is connected to the second balanced input/output terminal 110. The second end of the sixth transmission line 144 is connected to the second balanced node 122 of the balun portion 102.

The unbalanced side impedance transforming element 106 is connected between the unbalanced node 124 of the balun portion 102 and the unbalanced input/output terminal 112. The impedance transforming element 106 may be provided by a transmission line or alternatively by another inductive component such as a bond wire. Alternatively, the unbalanced side impedance transforming element 106 can be omitted such that the unbalanced node 124 is connected directly to the unbalanced input/output terminal 112. In examples that do include the unbalanced side impedance transforming element 106, the bandwidth of the circuit can be improved because the impedance transformation requirements for the balanced side impedance transforming element 104 can be reduced.

Figure 2:
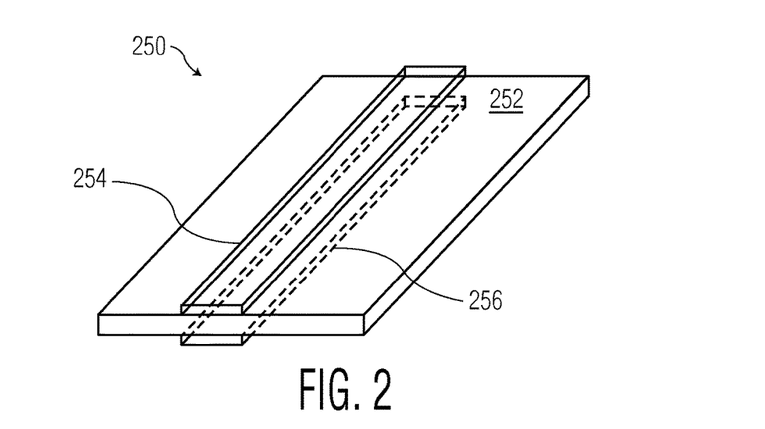
FIG. 2 illustrates a pair of broad-side coupled transmission lines.

FIG. 2 illustrates a pair of broad-side coupled transmission lines 250. In the case where the circuit of FIG. 1 is implemented on a circuit board or other dielectric layer 252, a pair of coupled transmission lines 254, 256 can be provided as a pair of broad-side coupled transmission lines 250 disposed on opposing surfaces 254 of the dielectric layer 252.

A balun disclosed herein may therefore be made using a two-layer printed circuit board structure and may require no, or minimal, external components. An advantage of such a structure is that a highly reproducible circuit behaviour may be achieved without the need to tune the circuit. This may be due to a greater uniformity in construction. That is, the tolerance of the balun can be improved, as can the ease of manufacture. As such, the cost of the circuit may also be reduced.

Figure 3:
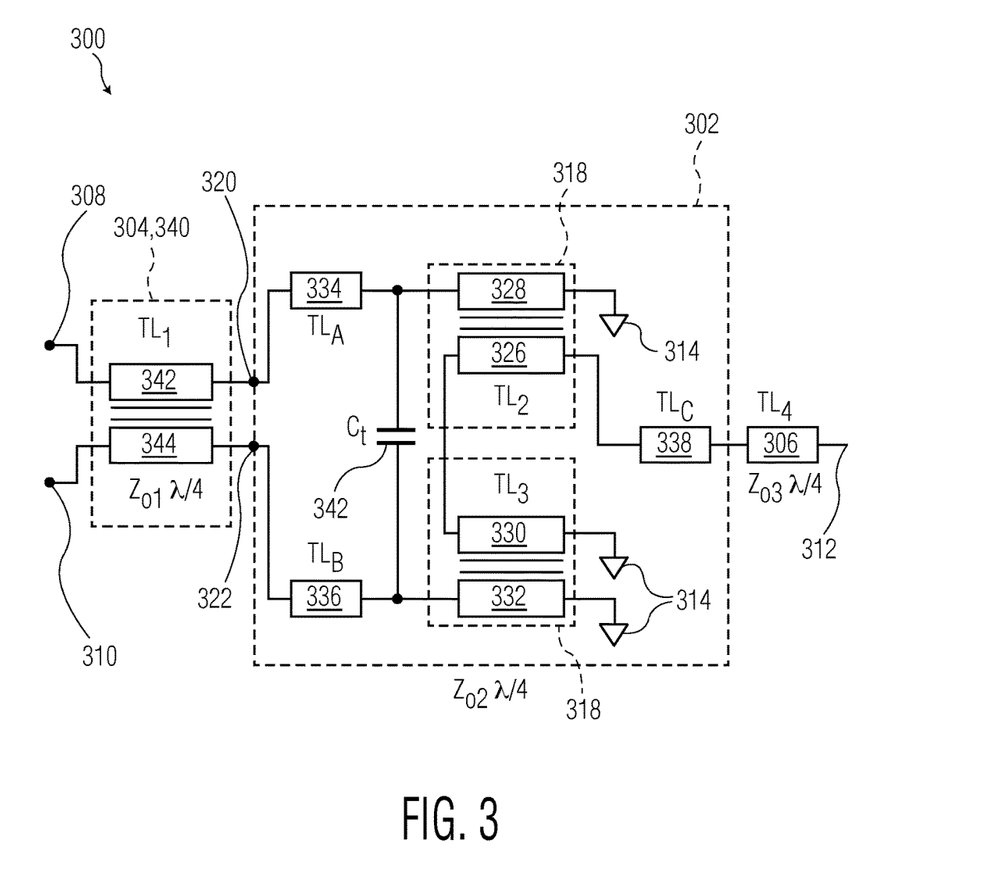
FIG. 3 illustrates another impedance transforming balun circuit similar to that of FIG. 1.

FIG. 3 illustrates another impedance transforming balun circuit 300 similar to that of FIG. 1. Corresponding series of reference numerals are used to refer to similar components between the figures. The similar components will not, in general, be discussed further.

The balun portion 302 additionally comprises an impedance tuning capacitor 342 connected between the first end of the second transmission line 328 and the first end of the fourth transmission line 332. The impedance tuning capacitor 342, together with the first and second matching elements 334, 336 can assist in setting an appropriate impedance at the first and second balanced nodes 320, 322. The achievable bandwidth of the impedance transforming balun circuit 300 may also be improved by the addition of the impedance tuning capacitor 342.

In this circuit, the components are configured such that each of the balun portion 302, balanced side impedance transforming element 304 and unbalanced side impedance transforming element 306 have a quarter wavelength path length. A quarter wavelength of an operating frequency band may be taken to be a quarter of the wavelength of a midpoint of the operating frequency band/range.

Figure 4:
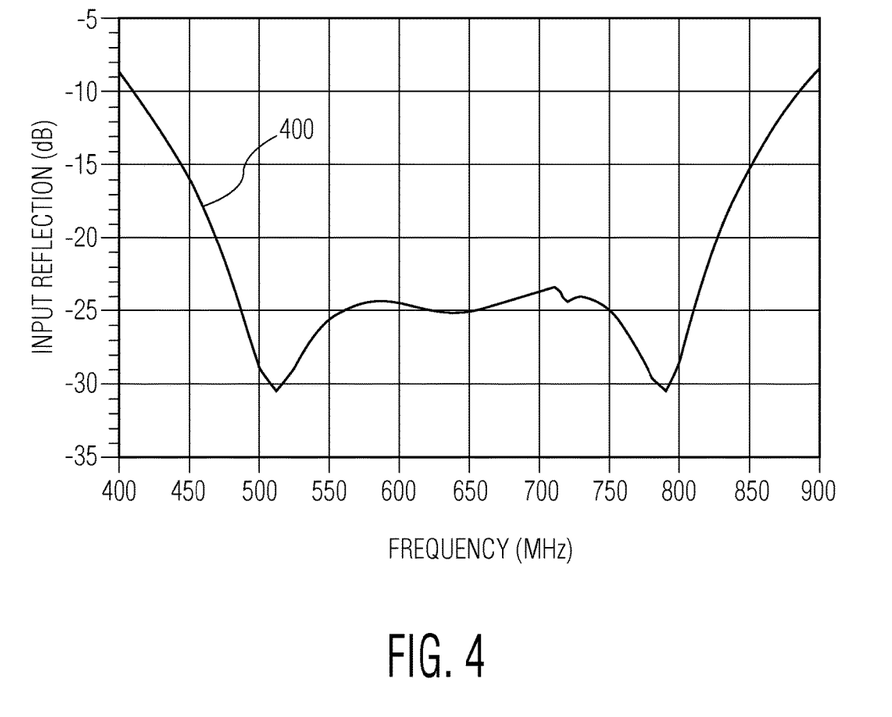
FIG. 4 illustrates an input reflection against frequency profile for the impedance transforming balun circuit of FIG. 3.
Figure 5:
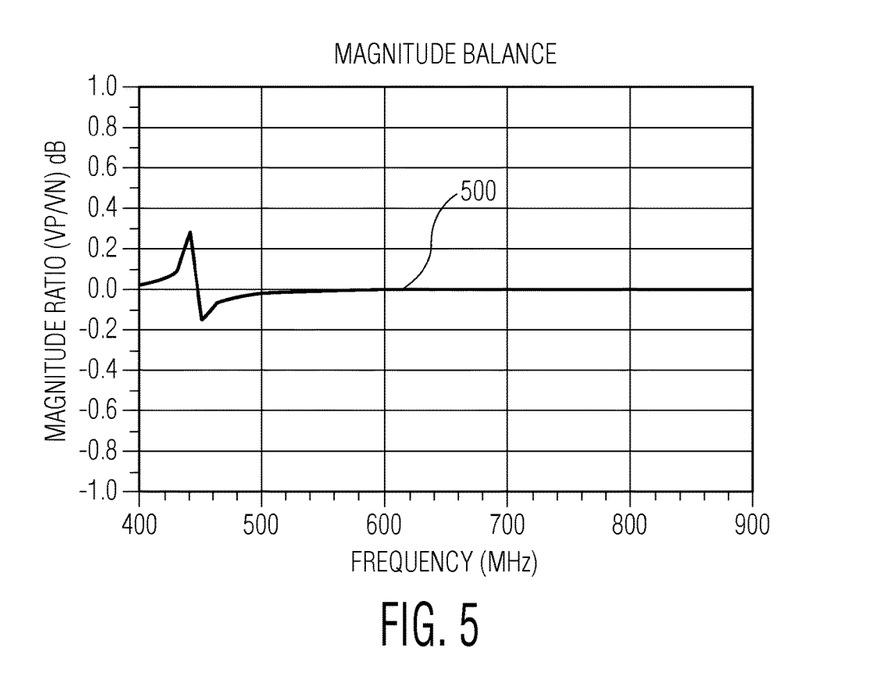
FIG. 5 illustrates a ratio of the two balanced side output signals when an unbalanced input signal is applied to the impedance transforming balun circuit of FIG. 3.
Figure 6:
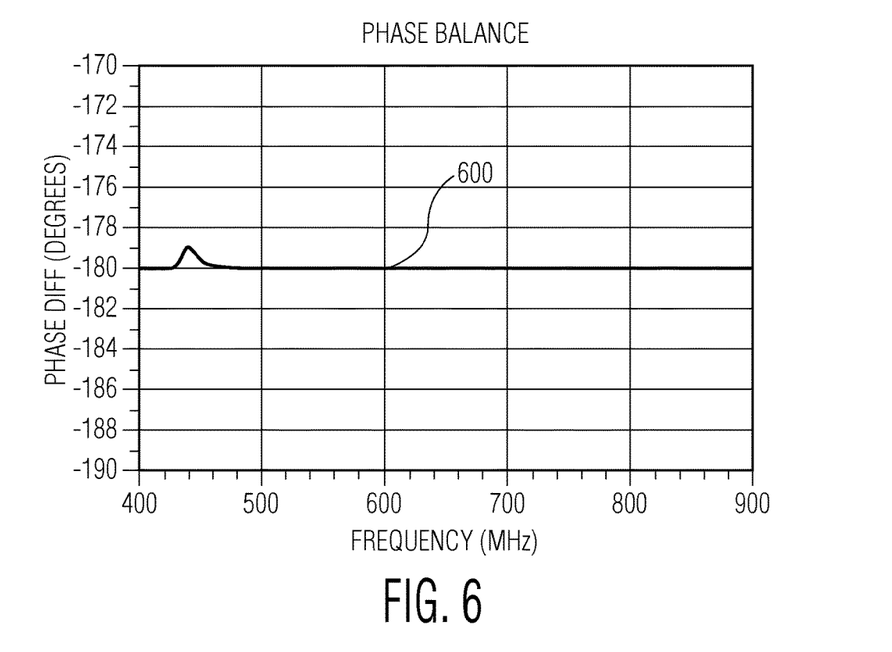
FIG. 6 illustrates a phase difference between the two balanced side output signals when an unbalanced input signal is applied to the impedance transforming balun circuit of FIG. 3.

The circuit 300 may provide an octave bandwidth with higher impedance transformation ratios than at least some prior art solutions. FIGS. 4 to 6 illustrate signal profiles 400, 500, 600 related to signals output at the first and second balanced input/output terminals 308, 310 of the impedance transforming balun circuit 300 of FIG. 3 when a variable frequency input signal is applied to the unbalanced input/output terminal 312.

FIG. 4 illustrates an input reflection (dB) against frequency profile 400 for the impedance transforming balun circuit of FIG. 3. The profile 400 is shown over the frequency range of 400 to 900 MHz. For some applications, an input reflection of less than −20 dB may be required. The input reflection profile 400 is less than −20 dB between 470 MHz and 830 MHz, which can be considered as representing a device with acceptable performance across a high bandwidth.

The input reflection falls from −9 dB at 400 MHz to a first minima of around −30 dB at about 510 MHz. The input reflection rises to around −24 dB between 570 and 730 MHz and falls to a second minima of around −30 dB at about 790 MHz. The input reflection rises to around −8 dB at 900 MHz. The profile 400 is roughly symmetrical about 650 MHz, which is the midpoint of the operating frequency band of 470 MHz and 830 MHz.

FIG. 5 illustrates a ratio profile (dB) 500 of the two balanced side output signals when an unbalanced input signal is applied to the impedance transforming balun circuit of FIG. 3. The profile 500 gives an indicator of the symmetry of the balun. For a symmetric balun, a signal at the first and second balanced input/output terminals would be expected to be the same for a given input signal received at the unbalanced input/output terminal. That is, the ratio of signals at the first balanced input/output terminal to the second balanced input/output terminal is ideally 1:1.

The profile 500 is shown over the frequency range of 400 to 900 MHz. The ratio is close to 0 dB (which corresponds to the ideal value of 1:1) between 500 and 900 MHz. A perturbation in the signal is seen at around 450 MHz. Again, the profile 500 of FIG. 5 illustrates acceptable performance of the circuit of FIG. 3 over a high bandwidth.

FIG. 6 illustrates a phase difference profile (degrees) 600 between balanced side output signals when an unbalanced input signal is applied to the impedance transforming balun circuit of FIG. 3. Ideally, the output signal at the first balanced input/output terminal should be 180 degrees out of phase with the output signal at the second balanced input/output terminal.

The profile 600 is shown over the frequency range of 400 to 900 MHz. The phase difference is 180 degrees between 400 MHz and 420 MHz and between 480 MHz and 900 MHz.

For applications in which a −20 dB input reflection is required, it can be seen from FIGS. 4 to 6 that the circuit of FIG. 3 can provide the required performance over a frequency band between around 470 MHz and 830 MHz, within the ultra-high frequency (UHF) spectrum. By varying the length or impedance of the transmission lines, the frequency response can be adapted to operate at other portions of the UHF spectrum or very-high frequency (VHF) spectrum, for example. In some applications, the circuit of FIG. 3 may be suitable to operate throughout the VHF or UHF spectrum.

Figure 7:
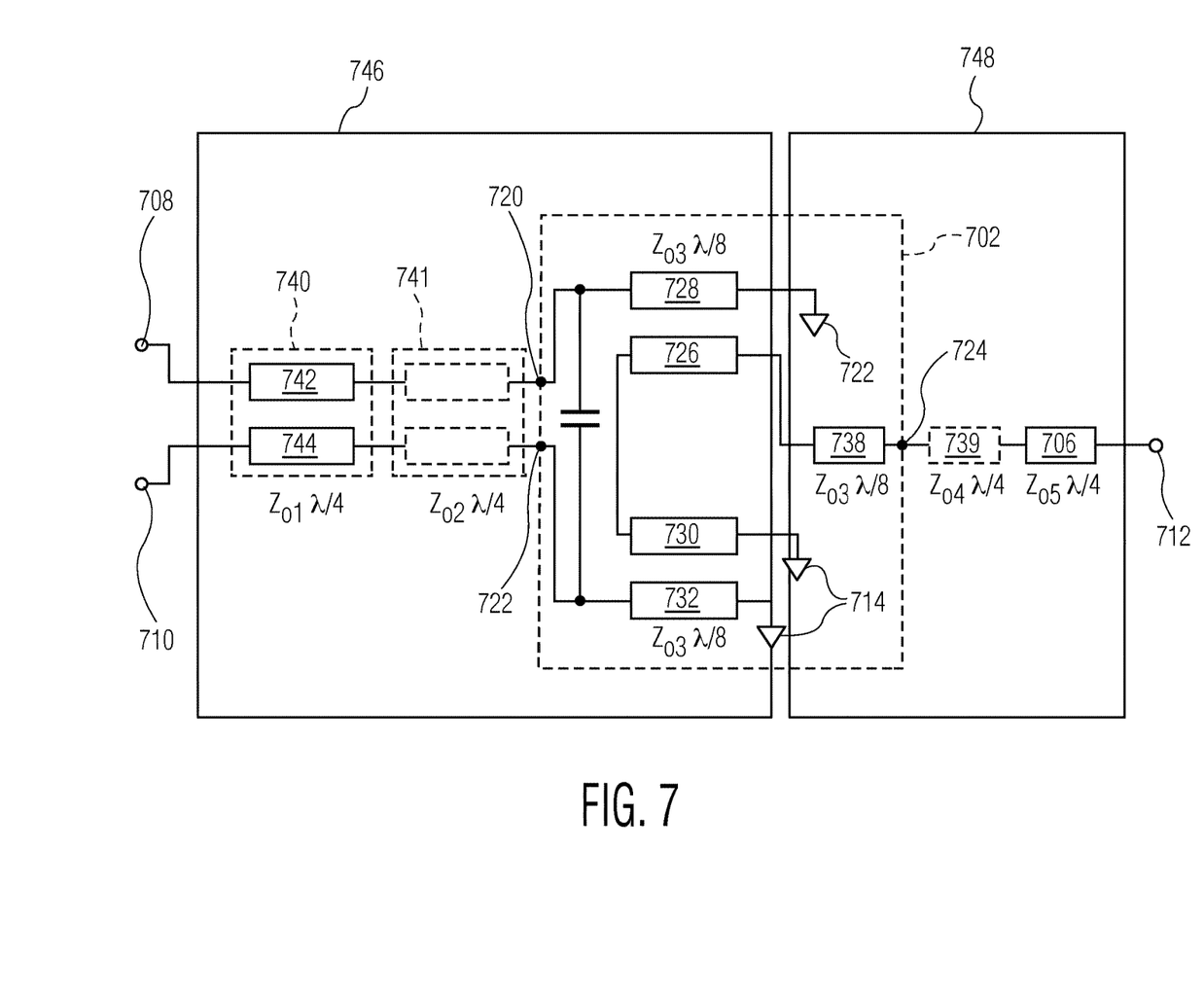
FIG. 7 illustrates another impedance transforming balun circuit similar to that of FIG. 3.
Figure 8:
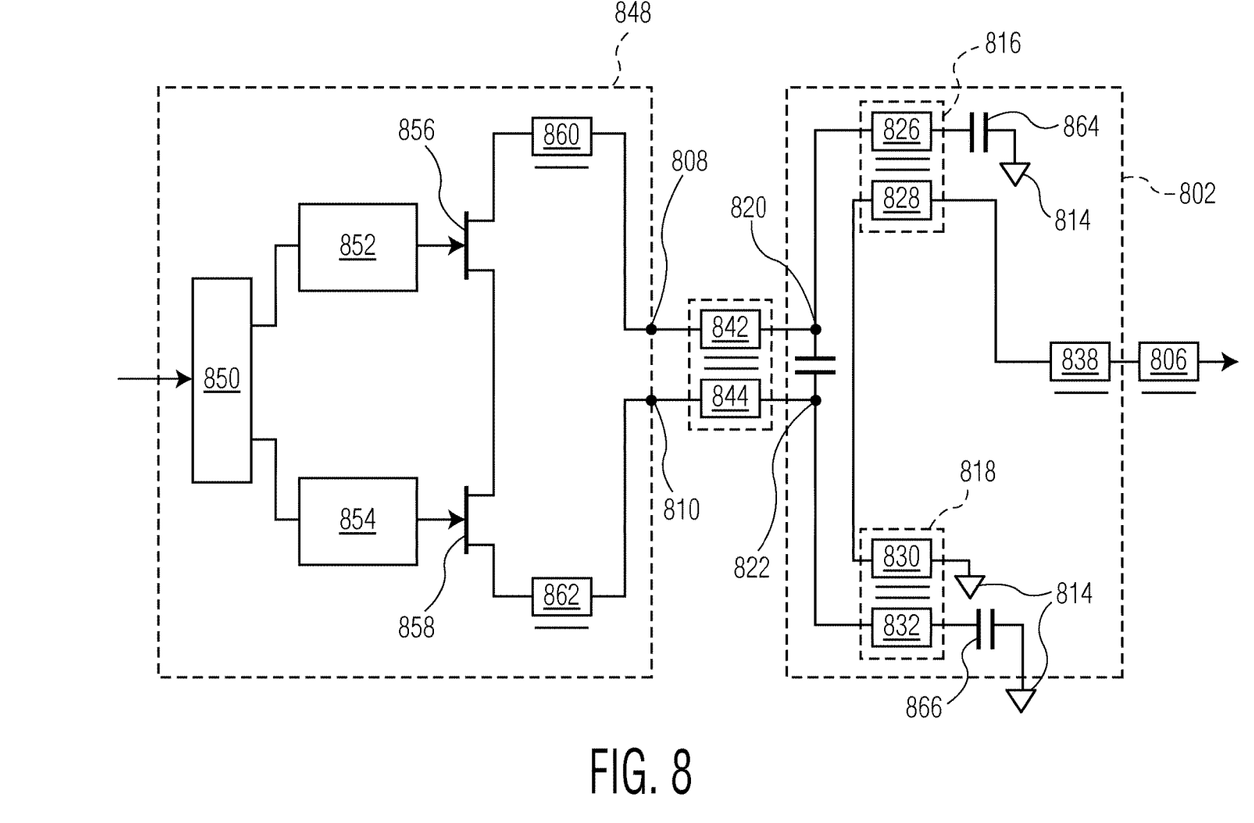
FIG. 8 illustrates a circuit comprising a push-pull amplifier with output terminals coupled to a balun circuit similar to that of FIG. 3.

FIGS. 7 and 8 provide further examples of impedance transforming balun circuits similar to that of FIG. 3. Corresponding series of reference numerals are used to refer to similar features in FIGS. 1, 3, 7 and 8. As with FIG. 3, in general, the similar features between the figures will not be discussed further.

In FIG. 7, five quarter-wavelength transmission elements are provided: the balanced side transmission element 740, a second balanced side transmission element 741, a balun portion 702, a first unbalanced side transmission element 739 and a second unbalanced side transmission element 706. By increasing the number of transmission elements, the bandwidth of the circuit can be increased because the individual impedance transformation work required for each element is reduced compared to a case where fewer elements are provided.

The balun portion has an overall length of $\lambda/4$ and comprises an unbalanced side matching transmission element 738. The first transmission line 726, second transmission line 728, third transmission line 730 and fourth transmission line 732 of the balun portion are each $\lambda/8$ capacitively and/or inductively coupled transmission lines provided by broad-side coupled transmission lines.

The second balanced side transmission element 741 is provided as a fourth pair of broad-side coupled transmission lines. The second balanced side transmission element 741 is provided in series with the first balanced side transmission element 740 between the balanced side terminals 708, 710 and the balanced side nodes 720, 722.

The first unbalanced side transmission element 739 is provided in series with the second unbalanced side transmission element 706 between the unbalanced side terminal 712 and the balanced side node 724.

The components in FIG. 7 are disposed on two separate circuit boards 746, 748. All of the coupled pairs of transmission lines are provided on a first, double sided board 746 and all of the single transmission lines are provided on a separate, second board 748. The second board 748 may be single sided. That is, conducting track may only be provided on one side of the second board 748.

FIG. 8 illustrates a circuit comprising a push-pull amplifier 848 with output terminals coupled to a balun circuit similar to that of FIG. 3. Such a circuit may be used to implement a UHF or VHF transmitter, for example.

The push-pull amplifier 848 has an input side balun 850 configured to receive an unbalanced signal and provide a balanced signal to a first wideband matching circuit 852 and a second wideband matching circuit 854, as is known in the art. The first and second wideband matching circuits 852, 854 feed respective first and second amplifiers 856, 858. The first amplifier 856 has a first amplifier output terminal connected to the first balanced input/output terminal 808 of the impedance transforming balun circuit by a first transmission line 860. The second amplifier 858 has a second amplifier output terminal connected to the second balanced input/output terminal 808 of the impedance transforming balun circuit by a second transmission line 862. The first and second transmission lines 860, 862 may have a length of λ/4.

The balun portion 802 does not comprise first and second matching elements in this example. A third matching element 838 is provided in order that the balun portion 802 provides a λ/4 signal path.

In this example, the balun portion 802 comprises a first DC decoupling capacitor 864 and a second DC decoupling capacitor 866. The first and second DC decoupling capacitors 864, 866 can reduce losses and heating in the system by blocking the path of DC signals from the Doherty amplifier to ground. The first DC decoupling capacitor 864 is connected between the second end of the second transmission line 828 and the ground terminal 822. The second DC decoupling capacitor 864 is connected between the second end of the fourth transmission line 832 and the ground terminal 822.

Any micro-strip or strip-line structure described herein may also be provided by its LC (inductor/capacitor) equivalent circuit, which is encompassed by the term "impedance transforming element". A transmission line is also an example of an "impedance transforming element".

Any components that are described herein as being "coupled" or "connected" could be directly or indirectly coupled or connected. That is, one or more components could be located between two components that are said to be coupled or connected whilst still enabling the required functionality to be achieved.

The invention claimed is:

1. A circuit comprising:
a first balanced terminal; a second balanced terminal; an unbalanced terminal; a ground terminal; a first substrate; a second substrate;
a balun portion comprising:
a first balanced node, a second balanced node, an unbalanced node connected to the unbalanced terminal,
a first transmission line with a first end and a second end, the second end of the first transmission line connected to the unbalanced node,
a second transmission line with a first end and a second end, the second transmission line capacitively and/or inductively coupled to the first transmission line, the first end of the second transmission line connected to the first balanced node, wherein the second end of the second transmission line is connected to the ground terminal,
a third transmission line with a first end and a second end, the first end of the third transmission line connected to the first end of the first transmission line, wherein the second end of the third transmission line is connected to the ground terminal,
a fourth transmission line with a first end and a second end, the first end of the fourth transmission line connected to the second balanced node, the fourth transmission line capacitively and/or inductively coupled to the third transmission line, wherein the second end of the fourth transmission line is connected to the ground terminal, and
at least one matching transmission element configured to present an impedance at one of the first balanced node, second balanced node or unbalanced node; and
a balanced side impedance transforming element comprising:
a fifth transmission line connected between the first balanced terminal and the first balanced node of the balun portion, and
a sixth transmission line connected between the second balanced terminal and the second balanced node of the balun portion, the sixth transmission line capacitively and/or inductively coupled to the fifth transmission line, wherein the first substrate comprises a planar dielectric layer, wherein each pair of coupled transmission lines are broad-side coupled transmission lines, wherein the broad-side coupled transmission lines of each pair are disposed on opposing surfaces of the planar dielectric layer of the first substrate, wherein the unbalanced node is disposed on the second substrate.

2. The circuit of claim 1 comprising an unbalanced side impedance transforming element connected between the unbalanced terminal and the unbalanced node of the balun portion.

3. The circuit of claim 1 wherein the at least one matching transmission element is connected between the ground terminal and one of the first balanced node, second balanced node or unbalanced node.

4. The circuit of claim 1 wherein the at least one matching transmission element is connected between the unbalanced node and the second end of the first transmission line.

5. The circuit of claim 1 wherein the at least one matching transmission element comprises a first matching transmission element and a second matching transmission element,
wherein the first matching transmission element is connected between the second balanced node and the first end of the second transmission line, and
wherein the second matching transmission element is connected between the first balanced node and the first end of the fourth transmission line.

6. The circuit of claim 5 wherein the first matching transmission element is a first matching transmission line and the second matching transmission element is a second matching transmission line capacitively and/or inductively coupled to the first matching transmission line.

7. The circuit of claim 1 comprising an impedance tuning capacitor connected between the first balanced node and the second balanced node.

8. The circuit of claim 1 wherein the balun portion comprises a first DC decoupling capacitor and a second DC decoupling capacitor,
wherein the first DC decoupling capacitor is connected between the second end of the second transmission line and the ground terminal, and
wherein the second DC decoupling capacitor is connected between the second end of the fourth transmission line and the ground terminal.

9. The circuit of claim 2 wherein the unbalanced side impedance transforming element comprises a transmission line connected between the unbalanced terminal and the second end of the second transmission line.

10. The circuit of claim 1 wherein each transmission line is a one quarter wavelength transmission line relative to an operating frequency.

11. The circuit of claim 1 wherein each transmission line comprises a strip-line or micro-strip.

12. The circuit of claim 1 comprising an amplifier having a first amplifier output terminal connected to the first balanced terminal and a second amplifier output terminal coupled to the second balanced terminal.

13. A UHF or VHF transmitter comprising the circuit of claim 1.

* * * * *